(12) United States Patent
Roseen, Jr. et al.

(10) Patent No.: US 7,549,220 B2
(45) Date of Patent: Jun. 23, 2009

(54) METHOD FOR MAKING A MULTILAYER CIRCUIT

(75) Inventors: E. Clifford Roseen, Jr., Warwick, RI (US); Scott D. Kennedy, Canterbury, CT (US); Doris I. Hand, Holland, MA (US); Michael S. White, Pomfret Center, CT (US); Allen F. Horn, III, Pomfret Center, CT (US)

(73) Assignee: World Properties, Inc., Lincolnwood, IL (US)

( * ) Notice: Subject to any disclaimer, the term of this patent is extended or adjusted under 35 U.S.C. 154(b) by 296 days.

(21) Appl. No.: 10/740,382

(22) Filed: Dec. 17, 2003

(65) Prior Publication Data

US 2005/0132566 A1    Jun. 23, 2005

(51) Int. Cl.
  *H05K 3/36*    (2006.01)
(52) U.S. Cl. ............... 29/830; 29/829; 29/831; 29/846; 156/272.2
(58) Field of Classification Search ............ 29/829, 29/830–834, 846–852; 156/272.2, 89.11; 174/255, 259, 264–265; 428/209, 901, 308.4
  See application file for complete search history.

(56) References Cited

U.S. PATENT DOCUMENTS

| | | | |
|---|---|---|---|
| 4,737,398 A | 4/1988 | Ikenaga et al. | |
| 4,802,061 A | 1/1989 | Portugall et al. | |
| 4,871,595 A | 10/1989 | Lusignea et al. | |
| 4,876,120 A | 10/1989 | Belke et al. | |
| 4,942,095 A | 7/1990 | Buchert et al. | |
| 4,963,428 A | 10/1990 | Harvey et al. | |
| 4,966,806 A | 10/1990 | Lusignea et al. | |
| 4,966,807 A | 10/1990 | Harvey et al. | |
| 4,975,312 A | 12/1990 | Lusignea et al. | |
| 5,079,289 A | 1/1992 | Layton et al. | |
| 5,164,458 A | 11/1992 | Jennings et al. | |
| 5,216,092 A | 6/1993 | Huspeni et al. | |
| 5,259,110 A | 11/1993 | Bross et al. | |
| 5,288,529 A | 2/1994 | Harvey et al. | |
| 5,360,647 A | 11/1994 | Sumida | |
| 5,360,672 A | 11/1994 | Saito et al. | |
| 5,529,740 A | 6/1996 | Jester et al. | |

(Continued)

FOREIGN PATENT DOCUMENTS

CA    2 273 542    12/1999

(Continued)

OTHER PUBLICATIONS

"Supporting The Practical Application of CSP, The Next-Generation Technology", Electronic Surface Mounting vol. 7, No. 6, pp. 54-55 (1997).

(Continued)

*Primary Examiner*—Minh Trinh
(74) *Attorney, Agent, or Firm*—Cantor Colburn LLP

(57) ABSTRACT

A method for the manufacture of a multilayer circuit comprising a liquid crystalline polymer layer, the method comprising treating the multilayer circuit with an amount of heat effective to raise the crystalline to nematic melting point, as defined by the peak endotherm above the glass transition temperature in a differential scanning calorimeter measurement, of the liquid crystalline polymer layer by at least about 10° C.

18 Claims, 2 Drawing Sheets

U.S. PATENT DOCUMENTS

| | | | |
|---|---|---|---|
| 5,703,202 | A | 12/1997 | Jester et al. |
| 5,719,354 | A | 2/1998 | Jester et al. |
| 5,847,039 | A | 12/1998 | Nagashima et al. |
| 5,900,292 | A | 5/1999 | Moriya |
| 6,027,771 | A | 2/2000 | Moriya |
| 6,124,004 | A | 9/2000 | Furuta et al. |
| 6,274,242 | B1 | 8/2001 | Onodera et al. |
| 6,472,076 | B1 | 10/2002 | Hacker |
| 6,538,211 | B2 | 3/2003 | St. Lawrence et al. |
| 6,602,583 | B2 * | 8/2003 | St. Lawrence et al. ...... 428/209 |
| 6,616,796 | B1 | 9/2003 | Onodera et al. |
| 6,623,711 | B2 | 9/2003 | Lyu et al. |
| 6,656,578 | B2 * | 12/2003 | Ohbe et al. .................. 428/221 |
| 6,716,919 | B2 | 4/2004 | Lichtenhan et al. |
| 6,824,884 | B2 * | 11/2004 | Taniguchi et al. ........ 428/473.5 |
| 7,033,675 | B2 * | 4/2006 | Taniguchi et al. ........... 428/458 |
| 7,059,039 | B2 * | 6/2006 | Tsukamoto et al. ........... 29/830 |
| 2001/0005545 | A1 | 6/2001 | Andou et al. |
| 2002/0028293 | A1 | 3/2002 | Yang et al. |
| 2002/0037397 | A1 | 3/2002 | Suzuki et al. |
| 2002/0074158 | A1 | 6/2002 | St. Lawrence et al. |
| 2002/0076538 | A1 | 6/2002 | St. Lawrence et al. |
| 2002/0081443 | A1 | 6/2002 | Connelly et al. |
| 2004/0262739 | A1 | 12/2004 | Sethumadhavan et al. |

FOREIGN PATENT DOCUMENTS

| | | |
|---|---|---|
| EP | 0 484 818 A2 | 5/1992 |
| EP | 0 507 332 A2 | 10/1992 |
| EP | 0 697 278 B1 | 2/1996 |
| EP | 0 949 067 A2 | 10/1999 |
| EP | 0 951 206 A2 | 10/1999 |
| EP | 1 044 800 A1 | 10/2000 |
| EP | 0 697 278 B1 | 4/2001 |
| JP | 06-252555 | 9/1994 |
| JP | 11-309803 | 11/1999 |
| JP | 2001-079946 | 3/2001 |
| JP | 2001-244630 | 9/2001 |
| WO | WO 2005/004220 | 1/2005 |

OTHER PUBLICATIONS

Vectra Liquid Crystal Polymer (LCP) Ticona Product Brochure, (www.ticona.com) (2001).
Yoshikawa, T. "Liquid Crystal Plymer (LCP) Film Vecstar", Electronic Parts and Materials, vol. 39, No. 10, pp. 42-46 (2000).
Yoshikawa, A. "Liquid Crystal Polymer Substrate for Multilayer PWB", Proc. 13th JIEP Annual Meeting, pp. 95-96 (1999).
International Search Report; International Application No. PCT/US2004/031730; Date of mailing: Feb. 10, 2005.
Written Opinion; International Application No. PCT/US2004/031730; Date of mailing: Feb. 10, 2005.
JP 06-252555 Publication Date:Sep. 9, 1994 (translation of abstract only).
JP 11-309803 Publication Date: Nov. 9, 1999 (translation of abstract only).
JP 2001-079946 Publication Date: Mar. 27, 2001 (translation of abstract only).

* cited by examiner

METHOD FOR MAKING A MULTILAYER CIRCUIT

BACKGROUND

This invention relates to multilayer circuits comprising liquid crystalline polymers (LCPs) and methods for the manufacture thereof.

As used herein, a circuit material is an article used in the manufacture of circuits and multilayer circuits, and includes circuit laminates, bond plies, conductive layers, resin coated conductive layers, and cover films. These circuit materials each comprise dielectric materials formed from a thermosetting or thermoplastic polymer. The dielectric material in a bond ply, resin covered conductive layer, or cover film may comprise a substantially non-flowable dielectric material, i.e., one that softens or flows during manufacture but not during use of the circuit. The dielectric material in a circuit laminate (i.e., a dielectric substrate), in contrast, is designed to not soften or flow during manufacture or use of the circuit or multi-layer circuit. Dielectric substrate materials are further typically divided into two classes, flexible and rigid. Flexible dielectric substrate materials generally tend to be thinner and more bendable than the so-called rigid dielectric materials, which typically comprise a fibrous web or other forms of reinforcement, such as short or long fibers or fillers.

Circuit laminates further have a conductive layer fixedly attached to a dielectric substrate layer. When a second conductive layer is disposed on the other side of the dielectric layer, the material is often referred to as a double clad circuit laminate. Patterning a conductive layer of a circuit laminate, for example by etching, provides a circuit layer. One or both of the conductive layers of a double clad laminate may be processed to provide circuit layers.

The aforementioned circuit materials and circuits may be combined in various configurations to provide multilayer circuits. "Multilayer circuits" as used herein refers to materials having at least twodielectric layers and at least three conductive layers, wherein at least one of the conductive layers is circuitized, and is inclusive of both subassemblies used to form finished circuits as well as the finished circuits themselves.

In one simple form, a multilayer circuit includes a double clad circuit and a resin coated conductive layer, wherein the dielectric material of the resin coated conductive layer is disposed on a circuit layer of the double clad circuit. In another embodiment, a second resin coated conductive layer is present, wherein the dielectric material of the second resin coated conductive layer is disposed on the second conductive layer (or circuit layer) of the double clad circuit. In still another simple form, a multilayer circuit includes a first circuit and a second circuit joined by a bond ply disposed between the circuit layer of the first circuit and the dielectric substrate of the second circuit. Typically, such multilayer circuits are formed by laminating the circuit(s) and/or circuit material(s) in proper alignment using heat and/or pressure. Bond plies can be used to provide adhesion between circuits and/or between a circuit and a conductive layer, or between two conductive layers. In place of a conductive layer bonded to a circuit with a bond ply, the multilayer circuit may include a resin coated conductive layer bonded directly to the outer layer of a circuit. In such multilayer structures, after lamination, known hole forming and plating technologies may be used to produce useful electrical pathways between conductive layers.

Liquid crystalline polymers are known for use as dielectric layers, bond plies, and in cap layers in circuits and multilayer circuits. Canadian Patent Application No. 2,273,542 to Forcier, for example, describes a circuit laminate made by bonding an adhesive resin-coated copper foil to a thin liquid crystal polymer film, but does not disclose how to make these circuit laminates into multilayer circuits.

It is further known to anneal liquid crystalline polymers prior to use in circuits, as annealing can increase their resistance to high temperatures, as well as properties such as solder resistance and in-plane coefficient of thermal expansion. The term "annealing" as used herein is the process of raising the crystalline to nematic melting point (as defined by the peak endotherm above the glass transition temperature in a differential scanning calorimeter (DSC) measurement) of a liquid crystalline polymer by holding the polymer at a temperature higher than its glass transition temperature, but lower than its melting point, for an extended period of time. As described in a brochure published by Ticona, the manufacturer of VECTRA® liquid crystalline polymer, "the high heat deflection resistance of Vectra® liquid crystalline polymers can further be raised by 30 to 50° C. by thermal aftertreatment of the molded parts." To anneal an liquid crystalline polymer composition with a melting point of 280° C., the brochure suggests heating the oven and parts from room temperature to 220° C. over 2 hours; gradually increasing the temperature from 220° C. to 240° C. over 1 hour; maintaining the temperature at 240° C. for 2 hours; gradually increasing the temperature from 240° C. to 250° C. over one hour; maintaining the temperature at 250° C. for 2 hours; and cooling to room temperature. Similar annealing cycles with different temperature set points for different grades of liquid crystalline polymer with different melting points and glass transition temperatures are also provided. U.S. Pat. No. 6,274,242 discloses use of specific heat treatment schedules to more rapidly anneal liquid crystalline polymer films.

While a variety of materials and methods are known for producing multilayer circuits using liquid crystalline polymers, including annealed liquid crystalline polymers, they suffer from a number of drawbacks that limit their utility. For example, since the temperature limit of conventionally electrically heated presses is less than or equal to about 280° C., it would be highly desirable to use bond plies that soften and flow at the comparatively low temperature of less than about 280° C., and preferably less than about 250° C. However, it is also highly desirable for multilayer circuits to resist temperatures of 260° C. or higher. This is particularly important for soldering operations for device attachment to the multi-layer circuit board. When current commercially available liquid crystalline polymers are used as bond plies, the bond plies re-melt upon soldering or other high temperature operations, which can cause blistering in the bond ply or dimensional distortion of the part.

U.S. Pat. No. 5,259,110 to Bross et al. discloses multilayer printed circuit boards having liquid crystalline polymer dielectric substrate layers. Bross et al. further discloses that several such layers may be bonded together using heat and pressure, and that a bond ply adhesive layer such as a another liquid crystalline polymer layer may be used. However, during fabrication of the multilayer boards of Bross et al., the liquid crystalline polymer layer must be heated at or above its melting point to achieve good adhesion, which can result in distortion or flow of the circuit layers.

U.S. Pat. No. 5,719,354 to Jester et al. discloses the fabrication of multilayer circuits using an liquid crystalline polymer bond ply with a melting temperature of at least 10° C. lower than that of the liquid crystalline polymer circuit layer dielectric material. The use of the lower melting bond ply eliminates or substantially reduces distortion of the circuit layers during lamination, but it also limits the maximum processing temperature of the multilayer circuit during subsequent lamination and/or component soldering to less than or equal to the melting temperature of the bond ply, in order to avoid distortion or blistering and loss of adhesion.

U.S. Pat. No. 6,538,211 to St. Lawrence et al. discloses a multilayer circuit comprising a circuit and a cap layer including a liquid crystalline polymer layer disposed on the circuit. This circuit can be used in adding fine line thin outer layers to a high wiring density multi-layer circuit board. However, if several cap layer are to be added sequentially to the multilayer circuit, cap layers having liquid crystalline polymers with sequentially lower melting points must be used in order to avoid distortion of the previously laminated layers. This can be particularly problematic, as any subsequent processing of the completed multilayer circuit such as soldering must be done at a temperature lower than melting point of the lowest melting point composition of the resin coated foil liquid crystalline polymer resin layers.

Accordingly, there remains a need in the art for a method for the manufacture of a multilayer circuit having a thermoplastic liquid crystalline polymer layer, wherein the method allows both assembly of the layers at temperatures usable with conventional electrically heated presses, and subsequent processing at higher temperatures without warping, blistering, and/or loss of bond.

BRIEF SUMMARY

The above-described drawbacks and disadvantages are alleviated by a method for the manufacture of a multilayer circuit comprising a liquid crystalline polymer layer, the method comprising treating the multilayer circuit with an amount of heat effective to raise the crystalline to nematic melting point, as defined by the peak endotherm above the glass transition temperature in a differential scanning calorimeter measurement, of the liquid crystalline polymer layer by at least about 10° C. Annealing of the multilayer circuit rather than the circuit material allows manufacture of the multilayer circuit at temperatures usable with conventional electrically heated presses, together with subsequent processing at higher temperatures without warping, blistering, and/or loss of bond.

The method furthermore allows the manufacture of multilayer circuits having a wide variety of configurations. In one embodiment, the multi-layer circuit comprises a first circuit bonded to a second circuit using a liquid crystalline polymer bond ply disposed between the two circuits. In another embodiment, a multi-layer circuit comprises a circuit (single or double clad) and a cap layer bonded to the circuit layer of the circuit. The above discussed and other features and advantages of the present invention will be appreciated and understood by those skilled in the art from the following detailed description.

BRIEF DESCRIPTION OF DRAWINGS

Referring now to the exemplary drawings wherein like elements are numbered alike in the several FIGURES.

DETAILED DESCRIPTION

Figure 1:
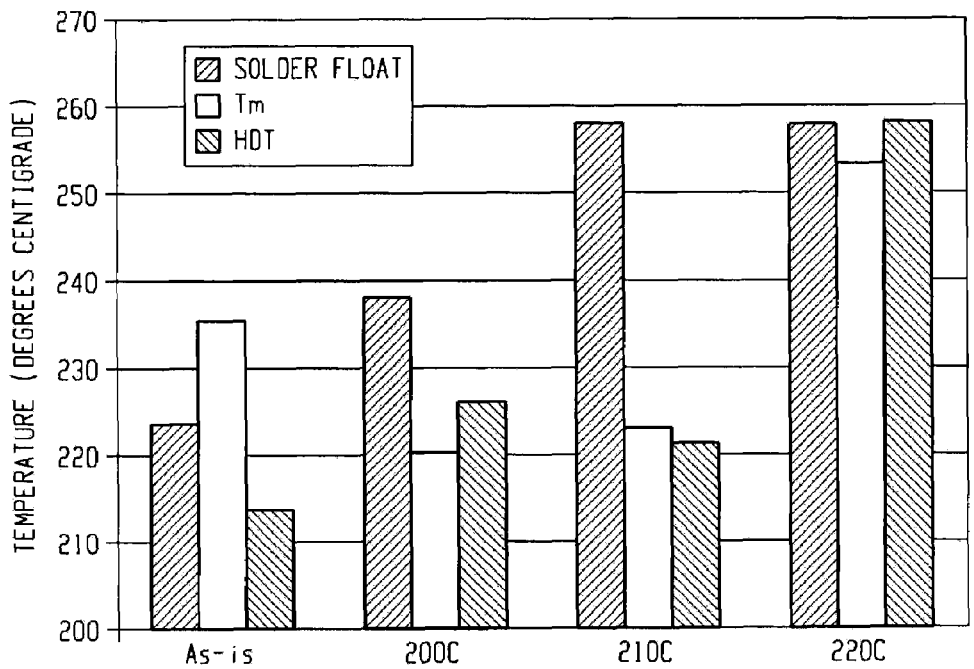
FIG. 1 shows comparative data for a comparative multi-layer circuit and a multilayer circuit of the invention.

The inventors hereof have found that in multilayer circuits comprising a liquid crystalline polymer layer, annealing the multilayer circuits after assembly provides significant advantages in subsequent assembly and manufacture, increasing both flexibility of the manufacturing process as well as allowing improved product quality. In particular, the method of this invention allows formation of multi-layer circuits under lower temperatures than previously practical, to produce multilayer circuits having higher temperature resistance than previously possible. The multilayer circuits are annealed by exposure to heat at a temperature between the glass transition temperature and the nematic melting point of the liquid crystalline polymer layer. Annealing raises the nematic melting point of the liquid crystalline polymer layer, thereby increasing the maximum temperature resistance of the multi-layer circuit. Preferably, the nematic melting point is raised at least about 10° C. or more, more preferably at least about 15° C. or more. This method allows the manufacture of a liquid crystalline polymer bonded multi-layer circuit or circuit subassembly with a maximum use temperature higher than the lamination temperature.

Liquid crystalline polymers suitable for use in method of manufacture described herein are known, and are sometimes described as "rigid-rod", "rod-like", or ordered polymers. These polymers are believed to have a fixed molecular shape, e.g. linear, or the like, due to the nature of the repeating units comprising the polymeric chain. The repeating units typically comprise rigid molecular elements. The rigid molecular elements (mesogens) are frequently rod-like or disk-like in shape and are typically aromatic and frequently heterocyclic. The rigid molecular elements may be present in either the main chain (backbone) of the polymer or in the side chains. When present in the main chain or in the side chains they may be separated by more flexible molecular elements, sometimes referred to as spacers.

Liquid crystalline polymers can be blended with polymers that are not liquid crystalline polymers, hereinafter referred to as non-liquid crystalline polymers. These blends are sometimes referred to as polymer alloys. Some of these blends have processing and functional characteristics similar to liquid crystalline polymers and are thus included within the scope of the present invention. The non-liquid crystalline polymers and liquid crystalline polymer components are generally mixed in a weight ratio of 10:90 to 90:10, preferably in the range of 30:70 to 70:30. Hereinafter the term liquid crystalline polymer will include liquid crystalline polymer blends.

Useful liquid crystalline polymers can be thermoplastic or thermosetting. Suitable thermotropic liquid crystalline polymers include liquid crystalline polyesters, liquid crystalline polycarbonates, liquid crystalline polyetheretherketones, liquid crystalline polyetherketoneketones, and liquid crystalline polyester imides, specific examples of which include (wholly) aromatic polyesters, polyester amides, polyamide imides, polyester carbonates, and polyazomethines.

Useful thermotropic liquid crystalline polymers also include polymers comprising a segment of a polymer capable of forming an anisotropic molten phase as part of one polymer chain thereof and a segment of a polymer incapable of forming an anisotropic molten phase as the rest of the polymer chain, and also a composite of a plurality of thermotropic liquid crystalline polymers.

Representative examples of the monomers usable for the formation of the thermotropic liquid crystalline polymers include: (a) at least one aromatic dicarboxylic acid compound, (b) at least one aromatic hydroxy carboxylic acid compound, (c) at least one aromatic diol compound, (d) at least one of an aromatic dithiol ($d_1$), an aromatic thiophenol ($d_2$), and an aromatic thiol carboxylic acid compound ($d_3$), and (e) at least one of an aromatic hydroxyamine compound and an aromatic diamine compound. The monomers may sometimes be used alone, but may frequently be used in a combination of monomers (a) and (c); (a) and (d); (a), (b) and (c); (a), (b) and (e); (a), (b), (c) and (e); or the like.

Examples of the aromatic dicarboxylic acid compound (a) include aromatic dicarboxylic acids such as terephthalic acid, 4,4'-diphenyldicarboxylic acid, 4,4'-triphenyldicarboxylic acid, 2,6-naphthalenedicarboxylic acid, 1,4-naphthalenedicarboxylic acid, 2,7-naphthalenedicarboxylic acid, diphenyl ether-4,4'-dicarboxylic acid, diphenoxyethane-4,4'-dicarboxylic acid, diphenoxybutane-4,4'-dicarboxylic acid, diphenylethane-4,4'-dicarboxylic acid, isophthalic acid, diphenyl ether-3,3'-dicarboxylic acid, diphenoxyethane-3,3'-dicarboxylic acid, diphenylethane-3,3'-dicarboxylic acid, and 1,6-naphthalenedicarboxylic acid; and alkyl-, alkoxy- and halogen-substituted derivatives of the above-mentioned aromatic dicarboxylic acids, such as chloroterephthalic acid, dichloroterephthalic acid, bromoterephthalic acid, methylterephthalic acid, dimethylterephthalic acid, ethylterephthalic acid, methoxyterephthalic acid, and ethoxyterephthalic acid.

Examples of the aromatic hydroxy carboxylic acid compound (b) include aromatic hydroxy carboxylic acids such as 4-hydroxybenzoic acid, 3-hydroxybenzoic acid, 6-hydroxy-2-naphthoic acid, and 6-hydroxy-1-naphthoic acid; and alkyl-, alkoxy- and halogen-substituted derivatives of the aromatic hydroxy carboxylic acids, such as 3-methyl-4-hydroxybenzoic acid, 3,5-dimethyl-4-hydroxybenzoic acid, 6-hydroxy-5-methyl-2-naphthoic acid, 6-hydroxy-5-methoxy-2-naphthoic acid, 2-chloro-4-hydroxybenzoic acid, 3-chloro-4-hydroxybenzoic acid, 2,3-dichloro-4-hydroxybenzoic acid, 3,5-dichloro-4-hydroxybenzoic acid, 2,5-dichloro-4-hydroxybenzoic acid, 3-bromo-4-hydroxybenzoic acid, 6-hydroxy-5-chloro-2-naphthoic acid, 6-hydroxy-7-chloro-2-naphthoic acid, and 6-hydroxy-5,7-dichloro-2-naphthoic acid.

Examples of the aromatic diol compound (c) include aromatic diols such as 4,4'-dihydroxydiphenyl, 3,3'-dihydroxydiphenyl, 4,4'-dihydroxytriphenyl, hydroquinone, resorcinol, 2,6-naphthalenediol, 4,4'-dihydroxydiphenyl ether, bis(4-hydroxyphenoxy)ethane, 3,3'-dihydroxydiphenyl ether, 1,6-naphthalenediol, 2,2-bis(4-hydroxyphenyl)propane, and bis(4-hydroxyphenyl)methane; and alkyl-, alkoxy- and halogen-substituted derivatives of the aromatic diols, such as chlorohydroquinone, methylhydroquinone, t-butylhydroquinone, phenylhydroquinone, methoxyhydroquinone, phenoxyhydroquinone, 4-chlororesorcinol, and 4-methylresorcinol.

Examples of the aromatic dithiol ($d_1$) include benzene-1,4-dithiol, benzene-1,3-dithiol, 2,6-naphthalene-dithiol, and 2,7-naphthalene-dithiol. Examples of the aromatic thiophenol ($d_2$) include 4-mercaptophenol, 3-mercaptophenol, and 6-mercapto-phenol. Examples of the aromatic thiol carboxylic acid ($d_3$) include 4-mercaptobenzoic acid, 3-mercaptobenzoic acid, 6-mercapto-2-naphthoic acid, and 7-mercapto-2-naphthoic acid.

Examples of the aromatic hydroxyamine compound and the aromatic diamine compound (e) include 4-aminophenol, N-methyl-4-aminophenol, 1,4-phenylenediamine, N-methyl-1,4-phenylenediamine, N,N'-dimethyl-1,4-phenylenediamine, 3-aminophenol, 3-methyl-4-aminophenol, 2-chloro-4-aminophenol, 4-amino-1-naphthol, 4-amino-4'-hydroxydiphenyl, 4-amino-4'-hydroxydiphenyl ether, 4-amino-4'-hydroxydiphenylmethane, 4-amino-4'-hydroxydiphenyl sulfide, 4,4'-diaminodiphenyl sulfide (thiodianiline), 4,4'-diaminodiphenyl sulfone, 2,5-diaminotoluene, 4,4'-ethylenedianiline, 4,4'-diaminodiphenoxyethane, 4,4'-diaminodiphenylmethane (methylenedianiline), and 4,4'-diaminodiphenyl ether (oxydianiline).

Thermotropic liquid crystalline polymers are prepared by a variety of esterification methods such as melt acidolysis or slurry polymerization, or the like methods. The molecular weight of the thermotropic liquid crystalline polyester that may favorably be used may be about 2,000 to about 200,000, with about 4,000 to about 100,000 preferred. The measurement of the molecular weight may be done, for example, either through determination of the terminal groups of a compressed film thereof according to infrared spectroscopy, or by gel permeation chromatography (GPC).

Thermotropic liquid crystalline polymers may be used either alone or in mixture of at least two thereof. A preferred thermotropic liquid crystalline polymer is 2-naphthalene carboxylic acid, 6-(acetyloxy)-polymer with 4-(acetyloxy) benzoic acid.

Suitable liquid crystalline polymers include, for example, VECTRA®, commercially available from Ticona, XYDAR®, commercially available from Amoco Polymers, and ZENITE®, commercially available from DuPont, among others. The liquid crystalline polymers and polymer blends described hereinabove are meant for illustration and not for limitation, as many other suitable liquid crystalline polymers and polymer blends are known in the art. Likewise, compatibilizers, plasticizers, flame retardant agents, and other additives may be contained in the liquid crystalline polymers. It is further contemplated that dielectric materials other than those disclosed herein may be used in combination with at least one liquid crystalline polymer layer in the formation of circuit materials, circuits and multi-layer circuits.

The liquid crystalline polymers may be used in the form of composites, comprising inorganic or organic particulate fillers, and/or woven or non-woven fabrics. Useful particulate fillers include, but are not limited to, titanium dioxide (rutile and anatase), barium titanate, strontium, titanate, silica (particles and hollow spheres) including fused amorphous silica and fumed silica; corundum, wollastonite, aramide fibers (e.g., KEVLAR from DuPont), fiberglass, $Ba_2Ti_9O_{20}$, glass spheres, quartz, boron nitride, aluminum nitride, silicon carbide, beryllia, alumina, and magnesia. The particulate fillers may be used alone or in combination. Particularly preferred particulate fillers are rutile titanium dioxide, and amorphous silica because these fillers have a high and low dielectric constant, respectively, thereby permitting a broad range of dielectric constants combined with a low dissipation factor to be achieved in the final product by adjusting the respective amounts of the two fillers in the composition.

When used, particulate filler may be present in an amount of about 1 to about 70 weight percent (wt %) of the total weight of the composition, with less than or equal to or equal to about 60 wt % preferred, and less than or equal to or equal to about 50 wt % more preferred.

Coupling agents may be used to promote the formation of or participate in covalent bonds connecting the filler surface with a polymer. Exemplary coupling agents include 3-mercaptopropylmethyldimethoxysilane and 3-mercaptopropyltrimethoxysilane. Coupling agents, when used, may be added in the amounts of about 0.1 wt % to about 1 wt % of the total weight of the resin composition.

Where used as a substantially non-flowable dielectric material such as a dielectric substrate for a rigid circuit laminates, a fibrous web may be incorporated into the liquid crystalline polymer. "Fibrous web" is herein defined as a woven or non-woven assemblage of fibers capable of withstanding the processing conditions involved in the formation of the dielectric material, bond ply material, circuit material, and circuit formed therefrom. Fibrous web materials may be organic or inorganic. Particularly useful fibrous webs may comprise materials with a melting point greater than or equal to the highest processing temperature. Exemplary fibrous webs have a melting point greater than or equal to about 250° C., with greater than or equal to or equal to about 280° C. preferred, and greater than or equal to or equal to about 300° C. more preferred. The fibrous web comprises thermally stable webs of a suitable fiber, preferably glass (E, S, and D glass) or high temperature polymer fibers (e.g., KODEL polyester from Eastman Kodak or polyphenylene sulfide fiber from Phillips Petroleum. Such thermally stable fiber reinforcement provides the composite with the desired structural rigidity. In addition, the use of the fibrous web renders a dielectric material, bond ply material, or circuit material with a relatively high mechanical strength.

Preferred examples of the fibrous web are set forth in the following

TABLE

| Manufacturer | Style | Thickness (inches) (micrometers) |
| --- | --- | --- |
| Fiber Glast | 519-A | 0.0015 (38.1) |
| Hexcel-Schwebel | 1674 | 0.0045 (114.3) |
| Hexcel-Schwebel | 1080 | 0.0025 (63.5) |
| BGF | 106 | 0.0015 (38.1) |
| BGF | 7628 | 0.0069 (175.26) |

Generally, the fibrous web is present in an amount that is less than or equal to or equal to about 50 wt % of the total liquid crystalline polymer composition, with less than or equal to or equal to about 40 wt % preferred, and less than or equal to or equal to about 30 wt % more preferred. The amount of fibrous web is preferably greater than or equal to or equal to about 10 wt %, with greater than or equal to or equal to about 15 wt % preferred, and greater than or equal to or equal to about 20 wt % more preferred. Useful thicknesses for the fibrous web are about 25 to about 150 micrometers, with about 50 to about 100 micrometers preferred.

Useful conductive layers for the formation of circuit materials, circuits, and multi-layer circuits include stainless steel, copper, aluminum, zinc, iron, transition metals, and alloys comprising at least one of the foregoing, with copper preferred. There are no particular limitations regarding the thickness of the conductive layer, nor are there any limitations as to the shape, size or texture of the surface of the conductive layer. Preferably however, the conductive layer comprises a thickness of about 3 micrometers to about 200 micrometers with about 9 micrometers to about 180 micrometers especially preferred. When two or more conductive layers are present, the thickness of the two layers may be the same or different.

Copper conductive layers are preferred. The copper conductive layer can be treated to increase surface area, treated with a stabilizer to prevent oxidation of the conductive layer (i.e., stainproofing), or treated to form a thermal barrier. Both low and high roughness copper conductive layers treated with zinc or zinc alloy thermal barriers are particularly useful, and may further optionally comprise a stain-proofing layer. Such copper conductive layers are available from, for example, Co-Tech under the trade names "TWX", "TW", and "TAX"; from Oak-Mitsui under the tradename "TOB"; from Circuit Foil Luxembourg under the tradename "TWS" and "NT TOR"; from Gould Electronics under the tradename "JTCS"; and from Chang Chun Petrochemical Company under the trade name "PINK".

Sometimes, solid sheets of the conductive cladding, such as ground or power planes may result in trapping the minute amounts of gaseous matter that can be released during annealing, resulting in blistering. If blistering between ground and power planes is encountered, using a "grid" plane structure can alleviate it. Essentially, the grid consists of a pattern of holes etched in the solid conductive plane that allows gases to escape when they are generated.

The multilayer circuits may be assembled and laminated using a batch wise or semi-continuous process as is known in the art. For example, the layers used to form the multilayer circuit are arranged in a desired order to form a stack. The layers may be assembled individually, or provided in the form of circuits and/or circuit materials such as circuit laminates, cap layers, and the like. The stack is then placed in a press, which may or may not be evacuated to form a vacuum. The temperature is typically increased at a rate of about 2 to about 10° C./minute under a pressure of about 0.5 to 3 MPa. Once the desired lamination temperature is reached the stack is held at the desired temperature and pressure for a time sufficient to adhere the layers, for example about 5 to about 45 minutes. While the desired temperature depends upon the composition of the liquid crystalline polymer and the other components of the stack material, the temperature is typically between the melting point of the liquid crystalline polymer and about 20° C. above the melting point of the liquid crystalline polymer. Such temperatures are generally about 200 to about 350° C. The annealing process as described herein advantageously allows use of liquid crystalline polymers that can be laminated at lower temperatures, preferably at temperatures of about 200 to about 290° C., more preferably about 200 to about 275° C., still more preferably about 200° C. to about 250° C. Such temperatures are compatible with conventional electrically heated presses. Accordingly, for lamination purposes, the melting point of the liquid crystalline polymer prior to annealing is preferably less than or equal to about 290° C., more preferably less than or equal to about 285° C., still more preferably less than or equal to about 250° C., more preferably less than or equal to about 240° C., and more preferably less than or equal to about 230° C.

The resulting multilayer circuit is then cooled, generally under pressure, and removed from the press when the temperature is less than or equal to about 100° C. The multilayer circuit may be stored prior to annealing.

The multilayer circuits are then annealed for a time and at a temperature effective to raise the nematic melting point of the liquid crystalline polymer layer, thereby improving the related thermal properties of the multilayer circuit, such as heat distortion temperature, solder resistance temperature, and/or maximum use temperature. Effective annealing temperatures are higher than the glass transition temperature but lower than the nematic melting point of the liquid crystalline polymer, and may be readily determined without undue experimentation based on the identity of the liquid crystalline polymer layer, the number of liquid crystalline polymer layers, the number and identity of other layers, and like considerations. Annealing generally comprises subjecting the multilayer circuit to a series of programmed temperatures that are higher than the glass transition temperature but lower than the melting point of the liquid crystalline polymer layer.

Preferably, annealing raises the melting point of the liquid crystalline polymer about 10° C. or more, preferably about 15° C. or more. The raised melting point is preferably greater than or equal to about 250° C., more preferably greater than or equal to about 290° C., and most preferably greater than or equal to about 300° C. Thus, in one preferred embodiment, a liquid crystalline polymer is selected wherein the effective laminating temperature is less than or equal to about 290° C., and the raised melting point of the annealed liquid crystalline polymer is greater than or equal to about 300° C. This may be achieved by using, for example, a liquid crystalling polymer bond ply having a melting point about 250 to about 290° C., and annealing the bond ply after lamination to raise the melting point to about 300 to about 315° C. In another embodiment, a liquid crystalline polymer is selected wherein the effective laminating temperature is less than or equal to about 250° C., and raised melting point of the annealed liquid crystalline polymer is greater than or equal to about 265° C. In still another embodiment, a liquid crystalline polymer is selected wherein the effective laminating temperature is less than or equal to about 235° C., and the raised melting point of the annealed liquid crystalline polymer is greater than or equal to about 250° C. This may be achieved by using, for example, a liquid crystalline polymer bond ply having a melting point about 200 to about 235° C., and annealing the bond ply after lamination to raise the melting point to about 250 to about 285° C.

In one embodiment, annealing of the multi-layer circuit is performed on a finished multilayer circuit in order to raise the melting point of the bonding layers, thereby increasing the solder resistance temperature, heat distortion temperature, and maximum use temperature of the finished multi-layer circuit.

Alternatively, annealing may be performed on a multi-layer circuit that is subsequently used in the formation of another multilayer circuit. In a preferred embodiment, multiple sequential annealing steps are performed as new layers are added. The process of circuitization of the outer conductive layers followed by annealing of the multi-layer circuit and subsequent lamination of additional conductive layers can be continued until the desired number of conductive layers has been reached. Advantageously, multiple sequential laminations using the same composition of liquid crystalline polymer bond ply and the same lamination temperature, without melting the previously laminated layers, can be performed.

Figure 2:
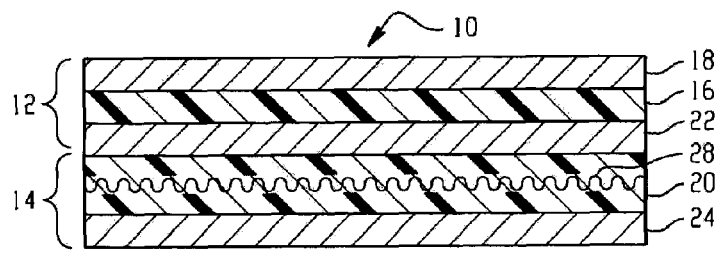
FIG. 2 is a schematic representation of an exemplary multi-layer circuit.

An exemplary embodiment of a multilayer circuit manufactured by the present method is shown in FIG. 2 at 10, and comprises a resin coated conductive layer 12 disposed on a double clad circuit 14. Double clad circuit 14 comprises a dielectric substrate 20 and two conductive layers 22, 24, wherein at least conductive layer 22 is circuitized. As used herein, "disposed" means that the layers partially or wholly cover each other. In one method of manufacture, the resin coated conductive layer 12, comprising a substantially flowable (at elevated temperature) dielectric material 16 and a conductive layer 18 is placed adjacent the circuit layer 22 of double clad circuit 14. Dielectric material 16 and/or dielectric substrate 20 comprises a liquid crystalline polymer. Dielectric substrate 20 may further include particulate filler and/or a woven web 28. Alternatively, woven web 28 may be replaced by a non-woven assemblage. The stack is then laminated, preferably at a temperature no more than about 20° C. above the melting point of the liquid crystalline polymer layer 16 and/or 20. The laminated multilayer circuit may then be annealed as described above, or used in the manufacture of other multilayer circuits.

Figure 3:
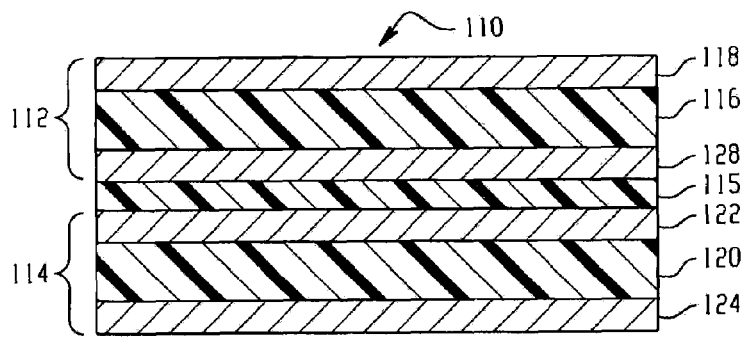
FIG. 3 is a schematic cross sectional representation of another exemplary multilayer circuit.

Another exemplary embodiment of a multilayer circuit 110 manufactured by the present method is shown in FIG. 3, and comprises a first circuit 112 bonded to a double clad circuit 114 by bond ply 115. First circuit 112 comprises a substantially nonflowable dielectric substrate 116 and a circuit layer 118. Double clad circuit 114 comprises a circuit layer 122, a substantially non-flowable dielectric substrate 120, and a conductive layer 124 disposed on the opposite side thereof. Conductive layer 124 may or may not be circuitized. Dielectric material 115 and/or one or both of dielectric substrates 116, 120 comprises a liquid crystalline polymer. Each of dielectric substrates 116, 120 may comprise particulate filler and/or a woven or nonwoven web (not shown). In one method of manufacture, bond ply 115 is placed between circuit layer 122 and dielectric substrate 116. The stack is then laminated, preferably at a temperature no more than about 20° C. above the melting point of the liquid crystalline polymer layer. The laminated multilayer circuit may then be annealed as described above, or used in the manufacture of other multilayer circuits.

Figure 4:
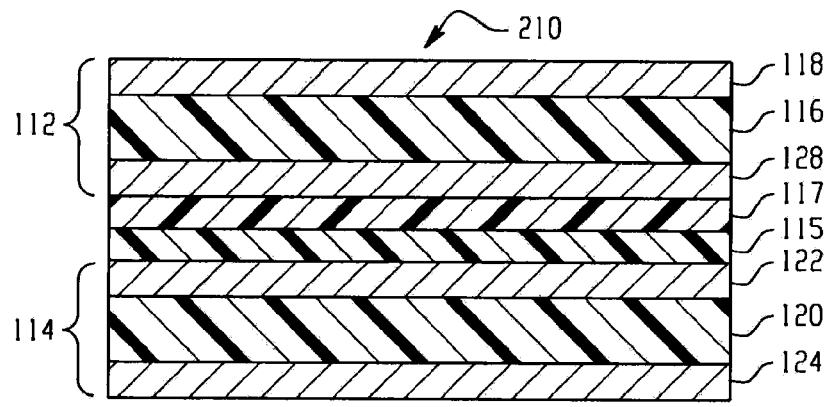
FIG. 4 is a schematic representation of another exemplary multi-layer circuit.

As shown in FIG. 4 at 210, the liquid crystalline polymer bond ply 115 may be combined with an additional polymer layer 117 to form a multiple-layer bond ply. Layer 117 is preferably a liquid crystalline polymer, and may have the same or different composition and/or characteristics as bond ply 115. In one embodiment, layer 117 is thinner and/or melts at a lower temperature than layer 115. Multilayer circuit 210 can be manufactured by placing a multilayer film comprising bond ply layers 115, 117 between circuit layer 122 and dielectric substrate 116 as shown, and laminating the stack. The laminated multilayer circuit may then be annealed as described above, or used in the manufacture of other multilayer circuits.

Figure 5:
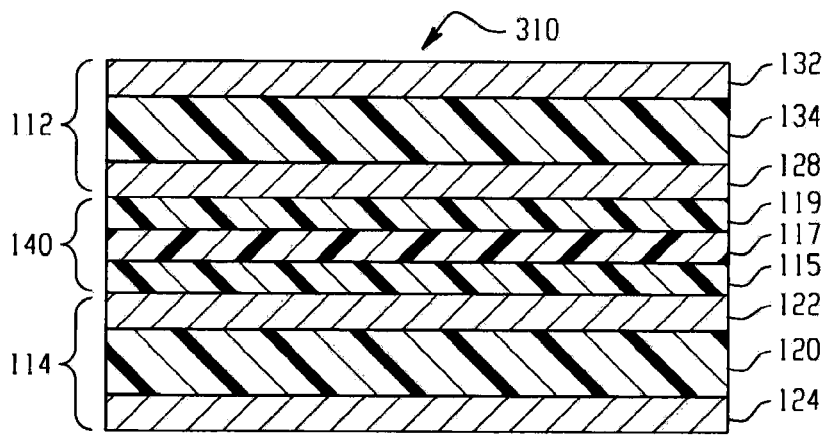
FIG. 5 is a schematic representation of another exemplary multi-layer circuit.

It is also within the scope of the invention to use more than one additional layer, as dictated by the requirements of the application. As shown in FIG. 5, an exemplary multilayer bond ply 140 comprises polymer layers 115, 117, and 119, wherein at least one, and preferably all of layers 115, 117, and 119 are liquid crystalline polymer layers. In one embodiment, layers 115 and 119 are thinner than layer 117, and/or melt at a lower temperature. Manufacture of multilayer circuit 310 in FIG. 5 can be effected by placing multilayer film 140 between circuit layer 136 and circuit layer 122 as shown, and laminating the stack. Multi-layer films comprising more than three layers (not shown) are also within the scope of the invention, comprising at least two exterior bond ply layers and as many interior bond ply layers as desired. The multi-layer film would then be disposed adjacent to the conductive layer or conductive layers to form a stack and laminated as described above.

Figure 6:
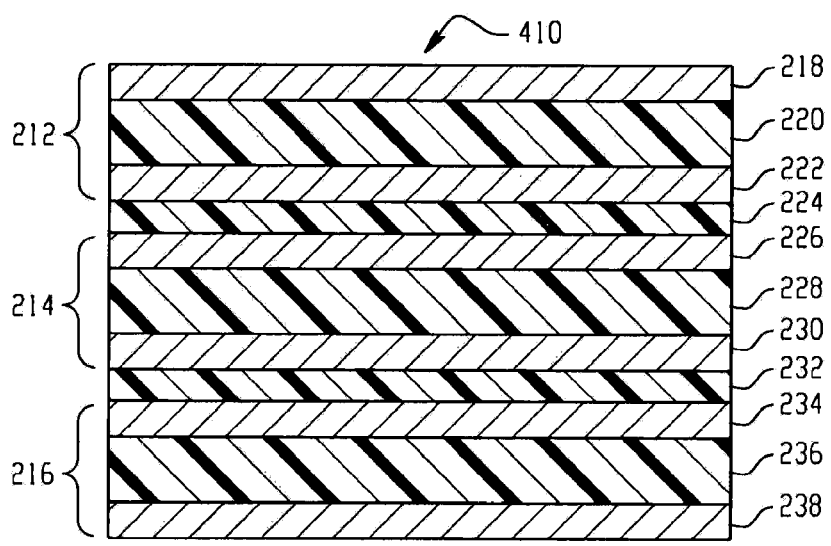
FIG. 6 is a schematic representation of still another exemplary multi-layer circuit.

Still another exemplary embodiment of a multilayer circuit manufactured by the present method is shown in FIG. 6 at 410, and comprises a first circuit 212 bonded to second circuit 214 by first bond ply 224, and third circuit 216 bonded to second circuit 214 by bond ply 232. First double clad circuit 212 comprises a substantially nonflowable dielectric substrate 222 and circuit layers 218, 224. Second circuit 214 is a double clad circuit and comprises a substantially nonflowable dielectric substrate 228 and two circuit layers 226, 230; and third circuit 216 comprises a substantially nonflowable dielectric substrate 236 and circuit layers 234, 238. Other configurations are also possible. One or more of bond plies 216, 232 and/or dielectric substrates 220, 228, 236 comprises a liquid crystalline polymer. Preferably, each is a liquid crystalline polymer. Each of dielectric substrates 222, 226, 230 may comprise particulate filler and/or a woven or nonwoven web.

In one method of manufacture, bond plies 224, 232 are placed between circuits 212, 214, 216 as shown and the stack is laminated, preferably at a temperature no more than about 20° C. above the melting point of the liquid crystalline polymer layer. The laminated multilayer circuit may then be annealed as described above, or used in the manufacture of other multilayer circuits.

In another method of manufacture, sequential annealing is used, i.e., bond ply 224 is placed between first and second circuits 212, 214 as shown, and the stack is laminated, preferably at a temperature no more than about 20° C. above the melting point of the liquid crystalline polymer layer, followed by annealing as described herein. Bond ply 232 is then placed between second circuit 214 and third circuit 218, and the stack is laminated, preferably at a temperature no more than about 20° C. above the lowest melting point of any of the liquid crystalline polymer layers. The resulting laminate may then be annealed, or used to form another multilayer circuit laminate.

Clearly there are a number of advantages of the instant method over the prior art. The use of a lamination temperature lower than 290° C. and preferably lower than 250° C. means that the lamination step can be performed with conventional electrically heated presses. Use of the novel post-lamination annealing step of the multi-layer circuit then raises the liquid crystalline polymer melting point to a value higher than that of the lamination temperature. This allows sequential annealing, and provides the multi-layer circuit manufacturer with maximum flexibility in manufacture.

The above-described method is further demonstrated by the following examples, which are meant to be illustrative, not limiting.

EXAMPLE 1

Increasing the temperature resistance of Vectra LKX 1112 Liquid Crystalline Polymer Bond Ply To demonstrate the increase in practical multi-layer circuit properties that are achievable with a post-lamination annealing step, the following experiment was conducted. Two sheets of 17-micrometer thick NT-TOR copper foil (manufactured by Circuit Foils Luxembourg) were laminated together with a 50-micrometer thick sheet of liquid crystalline polymer bond ply Vectra® LKX1112 liquid crystalline polymer (Ticona Corporation). Vectra LKX1112 liquid crystalline polymer exhibits a melting point (as measured by the peak value of the melting point by differential scanning calorimetry (DSC)) of 232° C. The press temperature program began with the press pre-heated to 95° C., increasing the temperature to 230° C. at a rate of 3.3° C./minute and a pressure of 400 psi), holding the press for 15 minutes at 230° C., and then cooling the press to room temperature at a rate of 3.3° C./minute.

Four different samples were prepared from the above-described laminate, an unannealed control and three samples annealed in an oven for eight hours at 200° C., 210° C., and 220° C.

The solder float resistance temperature was measured according to the IPC-TM-650 2.4.13 test method.

The melting point was measured by recording the peak endothermic value in a DSC trace, using a TA Instruments MDSC model 2920 in a nitrogen atmosphere at a heating rate of 10° C./minute.

The heat distortion temperature (HDT) was measured "in-plane" on a 3 mm×9 mm sample that was placed under a tensile load in a TA Instruments model 2940 thermo mechanical analyzer. The HDT is recorded as the temperature at which the sample abruptly yields under a tensile load of 0.01 Newton and a heating rate of 10° C./minute.

As shown in FIG. 1, annealing at 220° C. causes a substantial increase in all three practical thermal properties.

EXAMPLE 2

Multiple Sequential Multi-Layer Laminations with Rogers R/Flex 3800 LCPfilm.

The following example demonstrates sequential lamination using liquid crystalline polymer resin coated conductive foils and the improvement in the method achieved by annealing the multi-layer circuit subassemblies after lamination.

A circuit comprising Rogers R/flex 3800 liquid crystalline polymer film as the dielectric layer, and which is clad on both sides with copper foil is available from Rogers Corporation under the trade name R/flex 3850®. The liquid crystalline polymer circuit substrate in this material exhibits a nematic melting point as measured by DSC of 315° C. A circuit substrate having a Rogers R/flex 3800 liquid crystalline polymer film as the dielectric layer, and which is clad on one side with copper foil is available from Rogers Corporation under the trade name R/flex 3600®. The liquid crystalline polymer substrate in this material exhibits a nematic melting point of 290° C. as measured by DSC.

A model double-sided circuit was made by etching a series of parallel ⅛ inch wide lines into the copper foil of a 6 inch×6 inch×0.002 inch R/flex 3850® laminate. Two sheets of 0.002-inch thick R/flex 3600® circuit substrate were then laminated to the outside layers of the R/flex 3850® laminate at a temperature of 290° C. and a pressure of 75 psi for 35 minutes. The multi-layer circuit subassembly was cooled in the press to room temperature and the pressure then removed. One-eighth inch wide strips were etched in the outer layers of copper foil. The multi-layer circuit subassembly was then annealed by placing it in an oven between 0.100 inch thick stainless steel plates for 1.5 hours at a temperature of 270° C.

An additional two layers of 0.002 inch thick R/flex 3600® circuit substrate were laminated to the outside layers above mentioned multi-layer circuit subassembly at a temperature of 290° C. and a pressure of 75 psi for 35 minutes. The resulting multi-layer circuit subassembly (now with the additional two layers of R/flex 3600® substrate) was cooled in the press to room temperature and the pressure then removed. Once again, one-eighth inch wide strips were etched in the outer layers of copper foil and the multi-layer circuit subassembly was then annealed by placing it in an oven between 0.100 inch thick stainless steel plates for 1.5 hours at a temperature of 270° C.

The same process of adding outer layers of R/flex 3600®substrate was repeated, including the etching of the ⅛ inch wide lines and a third annealing step.

The nematic melting point of the outer layer film was measured after the third annealing step using the DSC method. The annealing was found to have increased the melting point of the R/flex 3600® substrate from 290° C. to 311° C.

The multi-layer circuit assembly was cross-sectioned and examined. No movement of the copper traces was found to have occurred during any of the three lamination steps.

The same process was repeated without the effective oven annealing steps. No substantial increase was noted in the nematic melting point. Significant movement of the etched copper lines in the inner layers was noted. Without the annealing step, sequential lamination of a multi-layer circuit subassembly using the same melting point liquid crystalline polymer material and same bonding temperature does not lead to a usable multilayer circuit.

While preferred embodiments have been shown and described, various modifications and substitutions may be made thereto without departing from the spirit and scope of the invention. Accordingly, it is to be understood that the present invention has been described by way of illustration and not limitations.

What is claimed is:

1. A method for the manufacture of a multilayer circuit, comprising
    laminating a stack comprising a first circuit, a second circuit, and a bond ply layer disposed therebetween, the bond ply comprising a liquid crystalline polymer layer having a glass transition temperature and a first crystalline to nematic melting point, as defined by the peak endotherm above the glass transition temperature in a differential scanning calorimeter measurement; and
    subsequent to said laminating, treating the laminated stack at a temperature between the glass transition temperature and the first melting point effective to raise the first melting point to a second crystalline to nematic melting point, as defined by the peak endotherm above the glass transition temperature in a differential scanning calorimeter measurement, wherein the second melting point is at least about 10° C. greater than the first melting point.

2. The method of claim 1, wherein the second melting point is at least about 15° C. greater than the first melting point.

3. The method of claim 1, wherein the first melting point is less than or equal to about 250° C.

4. The method of claim 1, wherein the first melting point is less than or equal to about 290° C.

5. The method of claim 1, wherein the second melting point is greater than or equal to about 250° C.

6. The method of claim 1, wherein the second melting point is greater than or equal to about 300° C.

7. The method of claim 1, wherein the laminating temperature is less than or equal to about 290° C., and the second melting point is greater than or equal to about 300° C.

8. The method of claim 1, wherein the laminating temperature is less than or equal to about 250° C., and the second melting point is greater than or equal to about 265° C.

9. The method of claim 1, wherein the laminating temperature is less than or equal to about 235° C., and the second melting point is greater than or equal to about 250° C.

10. The method of claim 1, further comprising
    laminating a second stack comprising the treated laminated stack, a third circuit, and a second bond ply layer disposed therebetween, the second bond ply comprising a liquid crystalline polymer layer having a glass transition temperature and a first crystalline to nematic melting point, as defined by the peak endotherm above the glass transition temperature in a differential scanning calorimeter measurement; and
    subsequent to laminating the second stack, treating the second laminated stack at a temperature between the glass transition temperature of the second bond ply and the first melting point of the second bond ply effective to raise the first melting point of the second bond ply to a second crystalline to nematic melting point of the second bond ply, as defined by the peak endotherm above the glass transition temperature in a differential scanning calorimeter measurement, wherein the second melting point of the second bond ply is at least about 10° C. greater than the first melting point of the second bond ply.

11. The method of claim 1, wherein the first and/or second circuit is a single clad circuit.

12. The method of claim 1, wherein the first and/or second circuit comprises a dielectric substrate layer disposed between two conductive layers, wherein at least one of the conductive layers is circuitized.

13. The method of claim 1, wherein the first and/or second circuits is a multilayer circuit.

14. A method for the manufacture of a multilayer circuit, comprising
    laminating a stack comprising a double clad circuit and a resin covered conductive layer, wherein the dielectric layer of the resin covered conductive layer is disposed on a circuit layer of the double clad circuit, and further wherein the dielectric laser of the resin covered conductive layer has a Tg and a first crystalline to nematic melting point, as defined by the peak endotherm above the glass transition temperature in a differential scanning calorimeter measurement; and
    subsequent to laminating the stack, treating the laminated stack at a temperature between the glass transition temperature and the first melting point effective to raise the first melting point to a second crystalline to nematic melting point, as defined by the peak endotherm above the glass transition temperature in a differential scanning calorimeter measurement, wherein the second melting point is at least about 10° C. greater than the first melting point.

15. The method of claim 14, further comprising
    disposing a second resin coated conductive layer on a second circuit layer of the double clad circuit, wherein the dielectric layer of the second resin covered conductive layer has a third glass transition temperature and a third crystalline to nematic melting point, as defined by the peak endotherm above the glass transition temperature in a differential scanning calorimeter measurement; and
    treating the laminated stack at a temperature between the glass transition temperature and the third melting point effective to raise the third melting point to a fourth crystalline to nematic melting point, as defined by the peak endotherm above the glass transition temperature in a differential scanning calorimeter measurement, wherein the fourth melting point is at least about 10° C. greater than the first melting point.

16. A method for the manufacture of a multilayer circuit, comprising
    laminating a stack comprising a double clad circuit, a first resin covered conductive layer, and a second resin covered conductive layer, wherein
    the double clad circuit comprises a dielectric substrate disposed between a first circuit layer and a second circuit layer;
    the first resin covered conductive layer comprises a first dielectric layer and a first conductive layer, wherein the first dielectric layer has a first glass transition temperature and a first crystalline to nematic melting point, as defined by the peak endotherm above the glass transition temperature in a differential scanning calorimeter measurement;
    the second resin covered conductive layer comprises a second dielectric layer and a second conductive layer, wherein the second dielectric layer has a second glass transition temperature and a second crystalline to nematic melting point, as defined by the peak endotherm above the glass transition temperature in a differential scanning calorimeter measurement; and further wherein the first dielectric layer is disposed on the first circuit layer and the second dielectric layer is disposed on the second circuit layer; and treating the laminated stack at a temperature between the first glass transition temperature and the first melting point effective to raise the first melting point to a third crystalline to nematic melting point, as defined by the peak endotherm above the glass transition temperature in a differential scanning calorimeter measurement, wherein the third melting point is at least about 10° C. greater than the first melting point.

17. The method of claim 16, wherein the treating temperature is between the second class transition temperature and the second melting point, and is effective to raise the second melting point to a fourth crystalline to nematic melting point, as defined by the peak endotherm above the glass transition temperature in a differential scanning calorimeter measurement, wherein, the fourth melting point is at least about 10° C. greater than the first melting point.

18. The method of claim 16, wherein the first and second glass transition temperatures are the same and the first and second melting points are the same.

* * * * *